United States Patent
Yeh et al.

(10) Patent No.: US 9,825,140 B2
(45) Date of Patent: Nov. 21, 2017

(54) METAL OXIDE THIN FILM TRANSISTOR

(71) Applicant: E Ink Holdings Inc., Hsinchu (TW)

(72) Inventors: Chia-Chun Yeh, Hsinchu (TW); Henry Wang, Hsinchu (TW); Xue-Hung Tsai, Hsinchu (TW); Chih-Hsuan Wang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 105 days.

(21) Appl. No.: 14/825,187

(22) Filed: Aug. 13, 2015

(65) Prior Publication Data

US 2015/0357475 A1    Dec. 10, 2015

Related U.S. Application Data

(63) Continuation of application No. 13/591,229, filed on Aug. 22, 2012, now Pat. No. 9,142,628.

(60) Provisional application No. 61/544,279, filed on Oct. 7, 2011.

(30) Foreign Application Priority Data

Apr. 18, 2012   (TW) .............................. 101113796 A

(51) Int. Cl.
  *H01L 29/49*   (2006.01)
  *H01L 29/417*  (2006.01)
  *H01L 29/786*  (2006.01)

(52) U.S. Cl.
  CPC .... *H01L 29/41733* (2013.01); *H01L 29/7869* (2013.01)

(58) Field of Classification Search
  CPC ..................... H01L 29/41733; H01L 29/7869
  See application file for complete search history.

(56) References Cited

U.S. PATENT DOCUMENTS

| | | | |
|---|---|---|---|
| 5,521,107 A | 5/1996 | Yamazaki et al. | |
| 5,825,050 A | 10/1998 | Hirakawa | |
| 6,218,219 B1 | 4/2001 | Yamazaki et al. | |
| 6,235,561 B1 | 5/2001 | Seiki et al. | |
| 6,384,427 B1 | 5/2002 | Yamazaki et al. | |
| 6,410,368 B1 | 6/2002 | Kawasaki et al. | |

(Continued)

FOREIGN PATENT DOCUMENTS

| | | |
|---|---|---|
| CN | 1652004 A | 8/2005 |
| CN | 101257048 A | 9/2008 |
| TW | 201115744 A | 5/2011 |

OTHER PUBLICATIONS

Corresponding Chinese Office Action that this art reference was cited on Dec. 22, 2015.

*Primary Examiner* — Michael Shingleton
(74) *Attorney, Agent, or Firm* — CKC & Partners Co., Ltd.

(57) ABSTRACT

A metal oxide thin film transistor (TFT) includes a gate electrode, a gate insulating layer, a metal oxide active layer, a source electrode, and a drain electrode. The gate electrode is formed on a substrate. The gate insulating layer is formed on the substrate and covers the gate electrode. The metal oxide active layer is formed on the gate insulating layer. The drain electrode and the source electrode are formed on two opposite ends of the metal oxide active layer in a spaced-apart manner, in which at least one of the orthographic projection of the source electrode and the orthographic projection of the drain electrode on the substrate does not overlap the gate electrode.

17 Claims, 4 Drawing Sheets

(56) References Cited

U.S. PATENT DOCUMENTS

| | | |
|---|---|---|
| 6,563,482 B1 | 5/2003 | Yamazaki et al. |
| 6,573,564 B2 | 6/2003 | Yamazaki et al. |
| 6,646,287 B1 | 11/2003 | Ono et al. |
| 7,643,115 B2 | 1/2010 | Sato et al. |
| 7,928,932 B2 | 4/2011 | Yamaguchi et al. |
| 8,785,922 B2 | 7/2014 | Yang et al. |
| 8,871,578 B2 | 10/2014 | Seo |
| 2001/0035920 A1* | 11/2001 | Choi .................. G02F 1/1362 349/54 |
| 2004/0119075 A1 | 6/2004 | Murade |
| 2008/0067508 A1 | 3/2008 | Endo et al. |
| 2009/0135112 A1 | 5/2009 | Uchino et al. |
| 2010/0006854 A1 | 1/2010 | Ono et al. |
| 2010/0244022 A1* | 9/2010 | Takahashi ........... H01L 29/7869 257/43 |

* cited by examiner

METAL OXIDE THIN FILM TRANSISTOR

RELATED APPLICATIONS

The present application is a Continuation application of the application Ser. No. 13/591,229, filed Aug. 22, 2012, which claims priority to U.S. Provisional Application Ser. No. 61/544,279 filed Oct. 7, 2011, and Taiwan Application Serial Number 101113796, filed Apr. 18, 2012, the disclosures of which are incorporated herein by reference in their entireties.

BACKGROUND

Field of Invention

The present invention relates to a thin film transistor (TFT). More particularly, the present invention relates to a metal oxide TFT.

Description of Related Art

With advances in display technology and semiconductor processes, flat panel displays have been used in many kinds of electronic devices. A modern flat panel display has a thin film transistor (TFT) array substrate which is formed by a plurality of pixel units arranged in an array. Each pixel unit comprises a driving TFT and a switching TFT. The driving TFT is configured to drive a light-emitting element, and by switching on or off the switching TFT, image data can be stored in each pixel unit. Thus, the image quality of the flat panel display is largely dependent upon the performance of the TFTs therein.

FIG. 1 is a sectional view of a prior art TFT 100, in which the material of an active layer 140 of the TFT 100 is amorphous silicon. When a voltage larger than a threshold voltage of the TFT 100 is applied to a gate electrode 120, a channel is formed within the amorphous silicon active layer 140, causing the TFT 100 to be switched on. However, due to the low carrier density and carrier mobility in the amorphous silicon, both the orthographic projections of a source electrode 150 and a drain electrode 160 on a substrate 110, which are marked P1, P2 in FIG. 1, are required to overlap the gate electrode 120. Moreover, the low carrier density and carrier mobility in the amorphous silicon also limit the operating speed of the TFT 100, and therefore place limitations on the development of high-quality flat panel displays.

Thus, there is an urgent need to eliminate such defects.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

One aspect of the invention is to provide a metal oxide TFT which includes a gate electrode, a gate insulating layer, a metal oxide active layer, a source electrode, and a drain electrode. The gate electrode is formed on a substrate. The gate insulating layer is formed on the substrate and covers the gate electrode. The metal oxide active layer is formed on the gate insulating layer. The drain electrode and the source electrode are formed on two opposite ends of the metal oxide active layer in a spaced-apart manner, in which at least one of the orthographic projection of the source electrode and the orthographic projection of the drain electrode on the substrate does not overlap the gate electrode.

According to one embodiment of the invention, the orthographic projection of the source electrode on the substrate overlaps the gate electrode, and the orthographic projection of the drain electrode on the substrate does not overlap the gate electrode.

According to one embodiment of the invention, the orthographic projection of the drain electrode on the substrate overlaps the gate electrode, and the orthographic projection of the source electrode on the substrate does not overlap the gate electrode.

According to one embodiment of the invention, neither the orthographic projection of the source electrode on the substrate nor the orthographic projection of the drain electrode on the substrate overlaps the gate electrode.

According to one embodiment of the invention, an interval between the orthographic projection of the source electrode on the substrate and the gate electrode is from 1 to 2.5 µm.

According to one embodiment of the invention, an interval between the orthographic projection of the source electrode on the substrate and the gate electrode is from 0.5 to 1 µm.

According to one embodiment of the invention, an interval between the orthographic projection of the source electrode on the substrate and the gate electrode is from 0 to 0.5 µm.

According to one embodiment of the invention, an interval between the orthographic projection of the drain electrode on the substrate and the gate electrode is from 1 to 2.5 µm.

According to one embodiment of the invention, an interval between the orthographic projection of the drain electrode on the substrate and the gate electrode is from 0.5 to 1 µm.

According to one embodiment of the invention, an interval between the orthographic projection of the drain electrode on the substrate and the gate electrode is from 0 to 0.5 µm.

According to one embodiment of the invention, the metal oxide TFT further includes an insulating layer overlaying the metal oxide active layer, the source electrode and the drain electrode.

In view of the description above, by utilizing the aforementioned metal oxide TFT, the defects present in a conventional amorphous silicon TFT such as low carrier density and mobility can be eliminated, and the operating speed of the TFT can be accelerated. In addition, by shortening the length of the gate electrode or by lengthening the interval between the source and the drain electrodes, overlapping between the orthographic projection of the source electrode on the substrate and the gate electrode and/or between the orthographic projection of the drain electrode on the substrate and the gate electrode is eliminated. Thus, the stability of a threshold voltage of the TFT can be improved, and the parasitic capacitance between the drain electrode and the gate electrode can be minimized. Accordingly, the capacitance coupling effect between the pixel units and the scan lines in the flat panel display can be also minimized, such that voltage shifts of the pixel units when the TFTs are switching on and off can be decreased, ultimately allowing for the image quality of the flat panel display to be improved.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
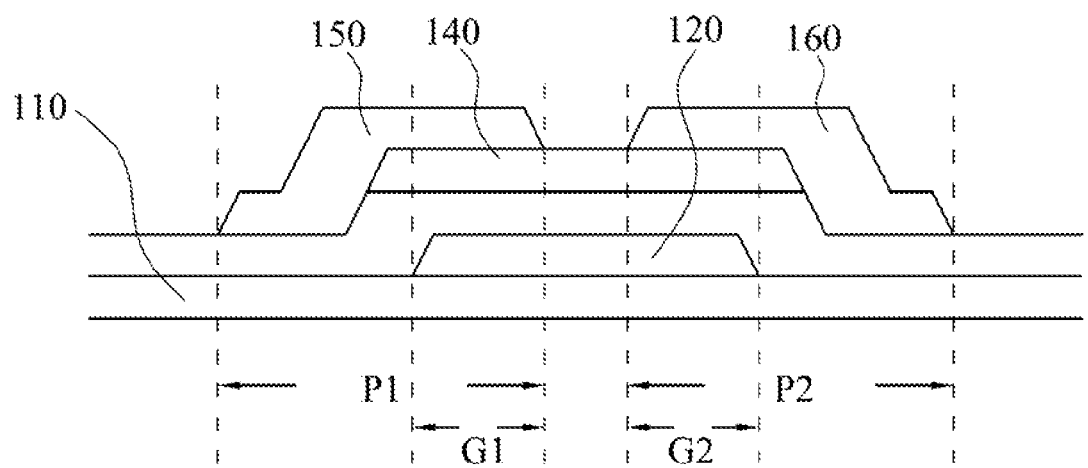
FIG. 1 is a sectional view of a prior art TFT.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

The embodiments of the invention provide a metal oxide TFT to solve the problem of low operating speed in a conventional TFT, and also to solve the problem of an excessive increase in the threshold voltage shift of the metal oxide TFT after the metal oxide TFT is bias stressed.

Figure 2:
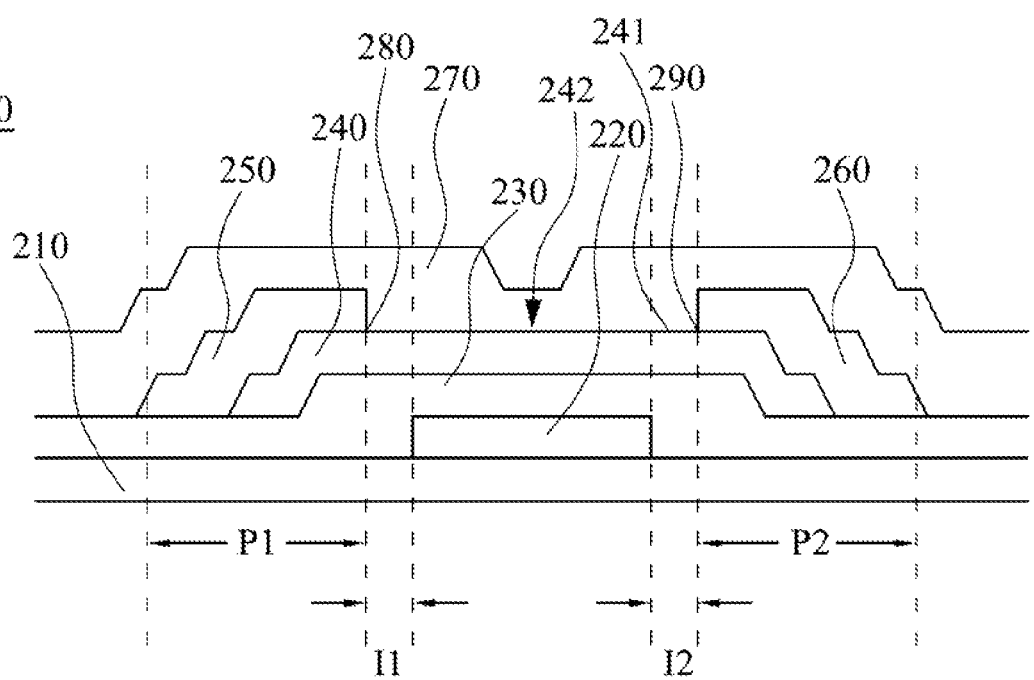
FIG. 2 is a sectional view of a metal oxide TFT according to an embodiment of the present invention.

FIG. 2 is a sectional view of a metal oxide TFT 200 according to an embodiment of the present invention. The metal oxide TFT 200 includes a gate electrode 220, a gate insulating layer 230, a metal oxide active layer 240, a source electrode 250, a drain electrode 260, and an insulating layer 270. The gate electrode 220 is formed on a substrate 210. The gate insulating layer 230 is formed on the substrate 210 and covers the gate electrode 220. The metal oxide active layer 240 is formed on the gate insulating layer 230. The drain electrode 260 and the source electrode 250 are formed on two opposite ends of the metal oxide active layer 240 in a spaced-apart manner. The insulating layer 270 overlays the metal oxide active layer 240, the source electrode 250 and the drain electrode 260. In this embodiment, orthographic projections of the source electrode 250 and the drain electrode 260 on the substrate 210, which are marked P1, P2 in FIG. 2, do not overlap the gate electrode 220 and the intervals between the orthographic projections P1, P2 and the gate electrode 220 are I1, I2 respectively. It is noted that "not overlap" herein refers to a configuration in which there is an interval I1 or I2 between the orthographic projection P1 and gate electrode 220 or between the orthographic projection P2 and gate electrode 220. The metal oxide active layer 240 has a top surface 241. The top surface 241 is located on the gap between the source electrode 250 and the drain electrode 260. The top surface 241 and the source electrode 250 cross at a first boundary 280. The top surface 241 and the drain electrode 260 cross at a second boundary 290. The top surface 241 has a gate-overlaying zone 242. An orthographic projection of the gate-overlaying zone 242 on the substrate 210 overlaps the gate electrode 220. The first boundary 280, the second boundary 290 and the gate-overlaying zone 242 are coplanar.

In this embodiment, the metal oxide active layer 240 is made using ZnO, IGO, IZO, IGZO, ZTO, IZTO, etc, but the present invention is not limited in this regard. Due to the fact that the metal oxide active layer 240 has a high carrier mobility, even though both the orthographic projections P1, P2 do not overlap the gate electrode 220, a channel' inside the metal oxide active layer 240 can still be formed. In addition, because the intensity of the vertical electric field given by the gate bias upon the metal oxide active layer 240 is varied inversely with the length of the interval I1, the length of the interval I1 can be from 0 to 2.5 μm. When the length of the interval I1 is between 1 and 25 μm, the metal oxide TFT 200 has characteristics of high drain current, low leakage current and low subthreshold swing. When the length of the interval I1 is from 0.5 and 1 μm, in addition to the characteristics of high drain current, low leakage current and low subthreshold swing, the carrier mobility of the metal oxide TFT 200 is further increased. Moreover, when the length of the interval I1 is between 0 and 0.5 μm, in addition to the characteristics of high drain current, low leakage current, low subthreshold swing, and high carrier mobility, the metal oxide TFT 200 also has a low threshold voltage. The length of the interval I2 also can be from 0 to 2.5 μm, and the relationship between the length of the interval I2 and the characteristics of the metal oxide TFT 200 is the same as or similar to that between the length of the interval I1 and the characteristics of the metal oxide TFT 200, and thus an explanation in this regard will not be repeated herein.

In this embodiment, when the interval I1 is lengthened, the parasitic capacitance between gate and source is decreased. Similarly, when the interval I2 is lengthened, the parasitic capacitance between gate and drain is decreased.

In the metal oxide TFT 200, the substrate 210 can be made using glass. The gate electrode 220, the source electrode 250, and the drain electrode 260 can be made using metal, nonmetal, conductive polymer, doped silicon, or combinations thereof. It is noted that these materials are provided by way of example, and do not limit the embodiments of the invention.

Figure 3:
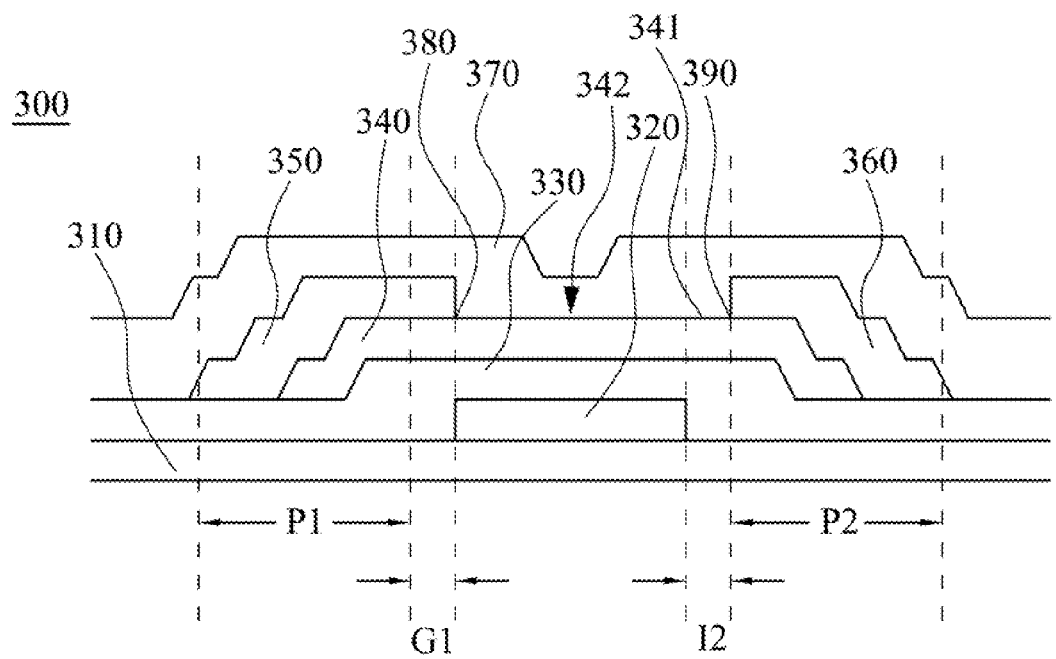
FIG. 3 is a sectional view of a metal oxide TFT according to another embodiment of the present invention.

FIG. 3 is a sectional view of a metal oxide TFT 300 according to another embodiment of the present invention. The metal oxide TFT 300 includes a gate electrode 320, a gate insulating layer 330, a metal oxide active layer 340, a source electrode 350, a drain electrode 360, and an insulating layer 370. The gate electrode 320 is formed on a substrate 310. The gate insulating layer 330 is formed on the substrate 310 and covers the gate electrode 320. The metal oxide active layer 340 is formed on the gate insulating layer 330. The drain electrode 360 and the source electrode 350 are formed on two opposite ends of the metal oxide active layer 340 in a spaced-apart manner. The insulating layer 370 overlays the metal oxide active layer 340, the source electrode 350 and the drain electrode 360. In this embodiment, the orthographic projection of the source electrode 350 on the substrate 310 is marked P1 in FIG. 3, and there is an overlap G1 between the orthographic projection P1 and the gate electrode 320. Moreover, the orthographic projection of the drain electrode 360 on the substrate 310 is marked P2 in FIG. 3, and there is an interval I2 between the orthographic projection P2 and the gate electrode 320.

The metal oxide active layer 340 has a top surface 341. The top surface 341 is located on the gap between the source electrode 350 and the drain electrode 360. The top surface 341 and the source electrode 350 cross at a first boundary 380. The top surface 341 and the drain electrode 360 cross at a second boundary 390. The top surface 341 has a gate-overlaying zone 342. An orthographic projection of the gate-overlaying zone 342 on the substrate 310 overlaps the gate electrode 320. The first boundary 380, the second boundary 390 and the gate-overlaying zone 342 are coplanar.

In this embodiment, the length of the interval I2 can be from 0 to 2.5 μm. The relationship between the length of the interval I2 and the characteristics of the metal oxide TFT 300 is the same as or similar to that of the aforementioned embodiment, and thus an explanation in this regard will not be repeated herein.

In this embodiment, because the capacitance of a capacitor will increase as the areas of the two charged plates thereof are increased, and will decrease as the distance between the two charged plates is increased when the length of the overlap G1 is increased such that the overlapping area is made larger, the parasitic capacitance between gate and source is increased, and when the interval I2 is lengthened, the parasitic capacitance between gate and drain is decreased. In other words, the parasitic capacitance between gate and drain can be minimized by increasing the interval I2 between the gate electrode 320 and the drain electrode 360 in this embodiment. Hence, if the metal oxide TFT 300 is applied to a TFT flat panel display, the capacitance coupling effect between the TFT scan lines and the pixel units is decreased such that the voltage shifts of the pixel units occurring when the TFTs are switched on or off can be reduced, and the operating speed of the TFTs can be accelerated. In addition, power loss associated with the switching of the TFTs can also be reduced.

Figure 4:
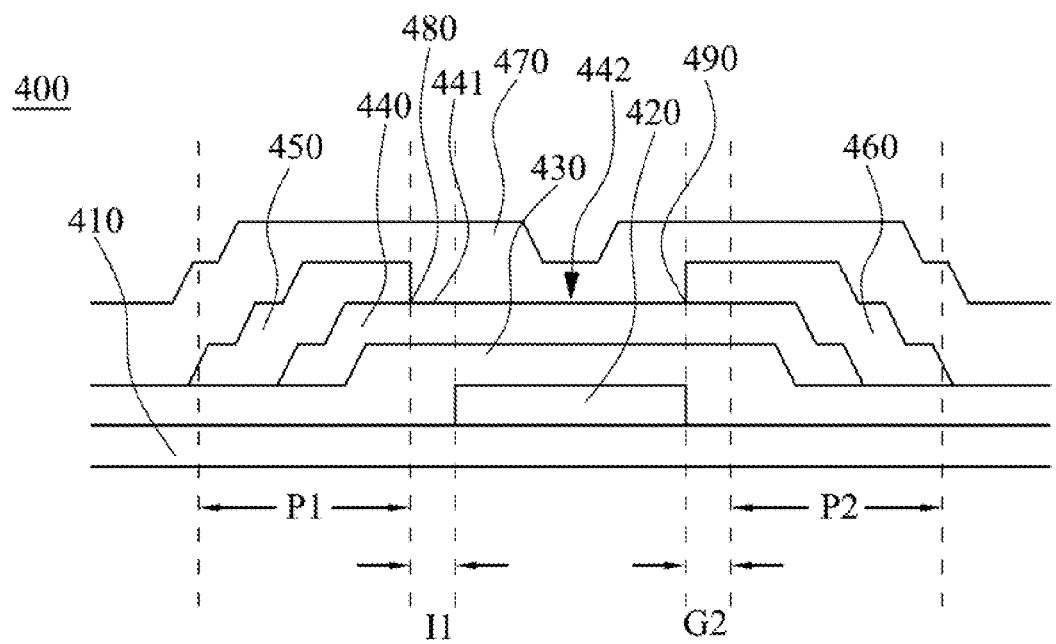
FIG. 4 is a sectional view of a metal oxide TFT according to still another embodiment of the present invention.

FIG. 4 is a sectional view of a metal oxide TFT 400 according to still another embodiment of the present invention. The metal oxide TFT 400 includes a gate electrode 420, a gate insulating layer 430, a metal oxide active layer 440, a source electrode 450, a drain electrode 460, and an insulating layer 470. The gate electrode 420 is formed on a substrate 410. The gate insulating layer 430 is formed on the substrate 410 and covers the gate electrode 420. The metal oxide active layer 440 is formed on the gate insulating layer 430. The drain electrode 460 and the source electrode 450 are formed on two opposite ends of the metal oxide active layer 440 in a spaced-apart manner. The insulating layer 470 overlays the metal oxide active layer 440, the source electrode 450 and the drain electrode 460. In this embodiment, the orthographic projection of the source electrode 450 on the substrate 410 is marked P1 in FIG. 4, and there is an interval I1 between the orthographic projection P1 and the gate electrode 420. The orthographic projection of the drain electrode 460 on the substrate 410 is marked P2 in FIG. 4, and there is an overlap G2 between the orthographic projection P2 and the gate electrode 420.

The metal oxide active layer 440 has a top surface 441. The top surface 441 is located on the gap between the source electrode 450 and the drain electrode 460. The top surface 441 and the source electrode 450 cross at a first boundary 480. The top surface 441 and the drain electrode 460 cross at a second boundary 490. The top surface 441 has a gate-overlaying zone 442. An orthographic projection of the gate-overlaying zone 442 on the substrate 410 overlaps the gate electrode 420. The first boundary 480, the second boundary 490 and the gate-overlaying zone 442 are coplanar.

In this embodiment, the length of the interval I1 can be from 0 to 2.5 μm. The relationship between the length of the interval I1 and the characteristics of the metal oxide TFT 400 is the same as or similar to that of the aforementioned embodiment, and an explanation in this regard will not be repeated herein.

In this embodiment, when the interval I1 is lengthened, the parasitic capacitance between gate and drain is decreased, and when the length of the overlap G2 is increased such that the overlapping area is larger, the parasitic capacitance between gate and source is increased. In another words, the parasitic capacitance between gate and source can be minimized by increasing the interval I1 between the gate electrode 420 and the source electrode 450 in this embodiment. Hence, the metal oxide TFT 400 can be applied to solve flickering in a flat panel display caused by parasitic capacitance between a gate and source.

Figure 5:
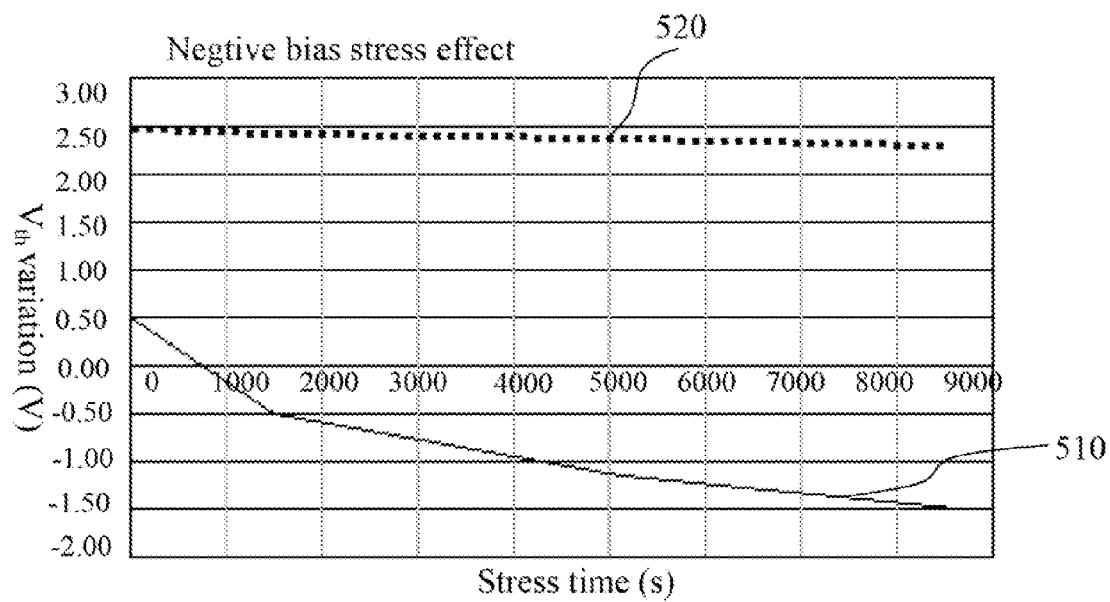
FIG. 5 is a diagram showing the negative bias stress effect of the metal oxide TFT in FIG. 2 compared with the negative bias effect of a comparative metal oxide TFT.

The threshold voltage shift of a metal oxide TFT may be excessively increased after the metal oxide TFT is bias stressed, and such a threshold voltage shift may negatively affect the switching operation of the metal oxide TFT. FIG. 5 is a diagram showing the negative bias stress effect of the metal oxide TFT 200 in FIG. 2 compared with the negative bias effect of a comparative metal oxide TFT. Referring to FIG. 1, except for replacing the amorphous silicon active layer 140 of the comparative metal oxide TFT with a metal oxide active layer, the structure of the comparative metal oxide TFT is substantially the same as that shown in FIG. 1, that is, both the orthographic projections of the source and drain electrode on the substrate overlap the gate electrode. The threshold voltage shift of this comparative metal oxide TFT is excessively increased after the comparative metal oxide TFT is bias stressed, as indicated by curve 510 shown in FIG. 5, and this threshold voltage shift may negatively affect the switching operation of the comparative metal oxide TFT, In the case of the metal oxide TFT 200, on the other hand, because both the orthographic projections P1, P2 do not overlap the gate electrode 220, a deterioration in the metal oxide active layer 240 caused by the vertical electric field can be reduced, such that the lifespan of the metal oxide active layer 240 can be extended, and the stability of the threshold voltage of the metal oxide TFT 200 can be maintained, as indicated by curve 520 shown in FIG. 5.

Figure 6:
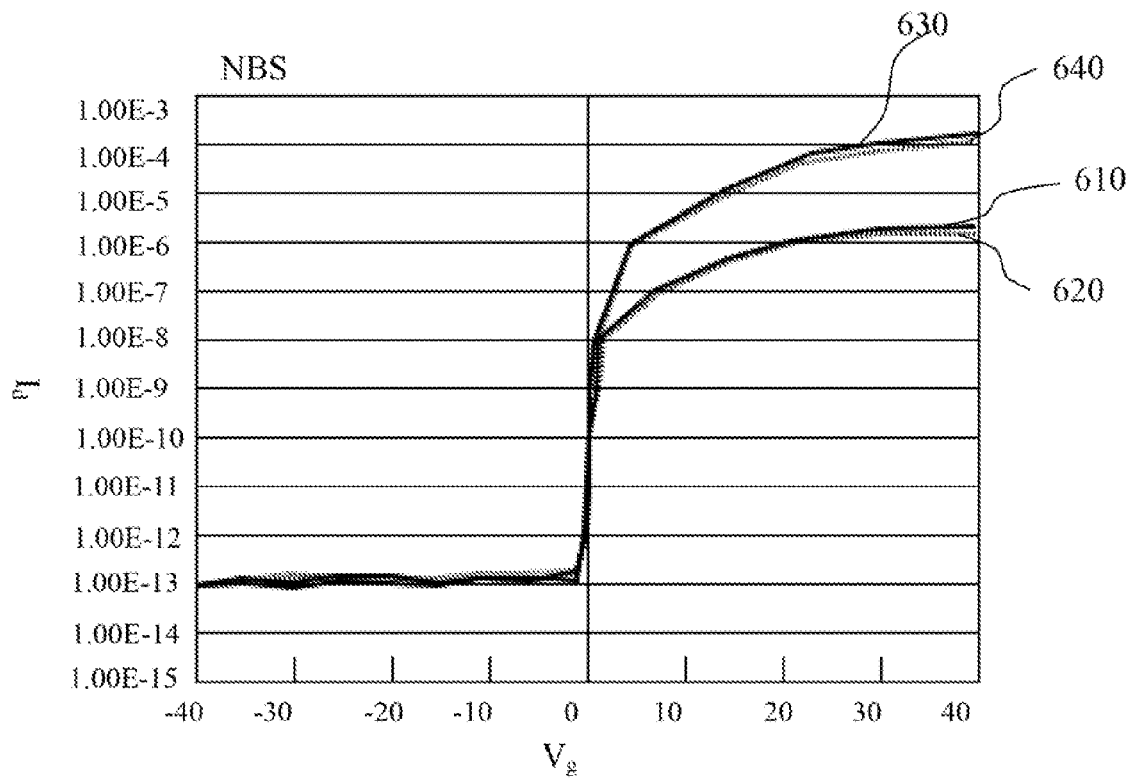
FIG. 6 is a voltage current diagram of a metal oxide TFT in one embodiment of the invention when the metal oxide TFT is under negative bias stress.

FIG. 6 is a voltage current diagram of the metal oxide TFT 200 in one embodiment of the invention when the metal oxide TFT 200 is under negative bias stress (NBS). In this embodiment, if the drain bias is 0.1V, the relationship between the negative gate bias ($V_g$) and the drain current ($I_d$) when the stress time is 0 seconds and 8700 seconds is shown as curve 610 and curve 620 respectively in FIG. 6. If the drain bias is 9.9V, the relationship between the negative gate bias and the drain current when the stress time is 0 seconds and 8700 seconds is shown as curve 630 and curve 640 respectively in FIG. 6. From the similarity between curve 610 and curve 620 and the similarity between curve 630 and 640, it may be determined that the operation of the metal oxide TFT 200 is stabilized, and the relationship between the negative gate bias and the drain current can be maintained after the gate has been provided a negative bias for a long time.

Figure 7:
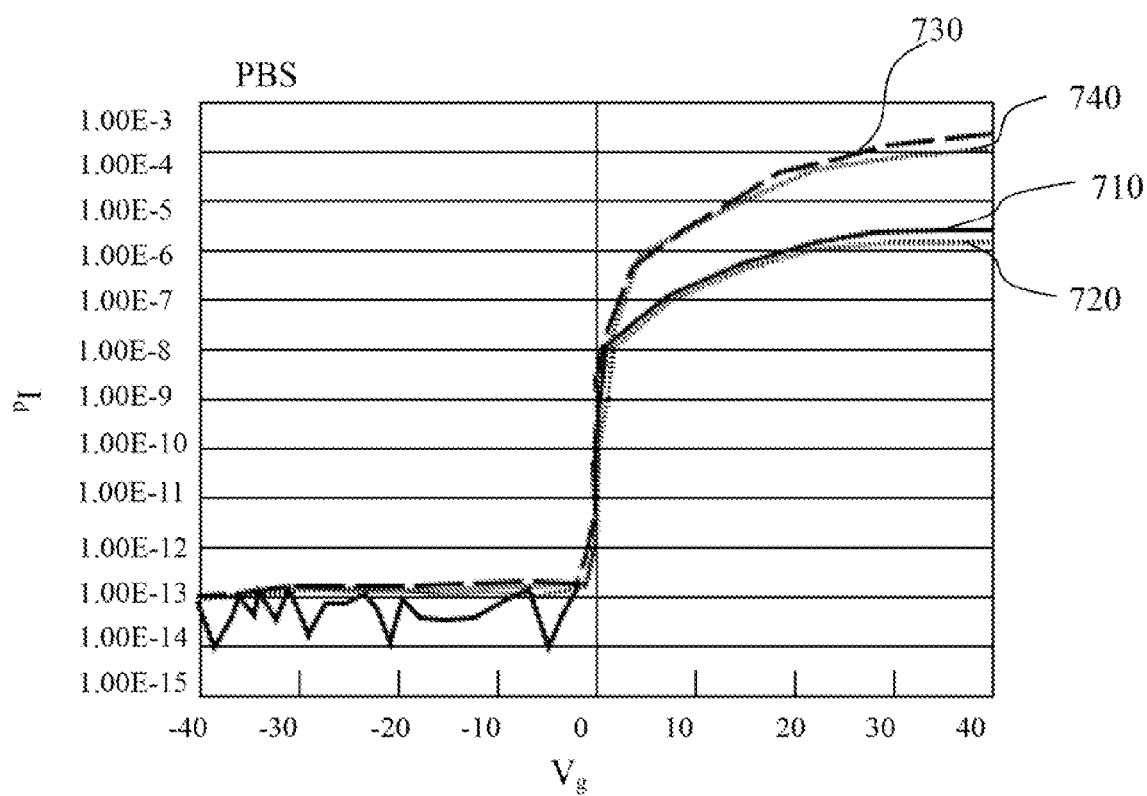
FIG. 7 is a voltage current diagram of a metal oxide TFT in one embodiment of the invention when the metal oxide TFT is under positive bias stress.

FIG. 7 is a voltage current diagram of the metal oxide TFT 200 in one embodiment of the invention when the metal oxide TFT 200 is under positive bias stress (PBS). In this embodiment, if the drain bias is 0.1V, the relationship between the positive gate bias ($V_g$) and the drain current ($I_d$) when the stress time is 0 seconds and 8700 seconds is shown as curve 710 and curve 720 respectively in FIG. 7. If the drain bias is 9.9V, the relationship between the positive gate bias and the drain current when the stress time is 0 seconds and 8700 seconds is shown as curve 730 and curve 740 respectively in the FIG. 7. From the similarity between curve 710 and curve 720 and the similarity between curve 730 and curve 740, it may be determined that the operation of the metal oxide TFT 200 is stabilized, and the relationship between the positive gate bias and the drain current can be maintained after the gate has been provided a positive bias for a long time.

In summary, by utilizing metal oxides as the material of the active layer, and by maintaining an appropriate interval between the orthographic projection of the source electrode on the substrate and the gate electrode and/or between the orthographic projection of the drain electrode on the substrate and the gate electrode, the carrier mobility of the TFT can be improved, and the stability of the TFT can be ensured. Therefore, not only can the operating speed of the TFT be accelerated, but the TFT can also have a high output current. Thus, the image quality of a flat panel display can be enhanced.

Although the present invention has been described in considerable detail with reference to certain embodiments thereof, other embodiments are possible. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A metal oxide thin film transistor (TFT) comprising:
a gate electrode formed on a substrate;
a gate insulating layer formed on the substrate and covering the gate electrode;
a metal oxide active layer formed on the gate insulating layer;
a source electrode and a drain electrode formed on two opposite ends of the metal oxide active layer in a spaced-apart manner and defining a gap, wherein at least one of an orthographic projection of the source electrode and an orthographic projection of the drain electrode on the substrate does not overlap the gate electrode; and
an insulating layer over the substrate;
wherein the metal oxide active layer has a top surface, the top surface is located on the gap between the source electrode and the drain electrode, the top surface and the source electrode cross at a first boundary, the top surface and the drain electrode cross at a second boundary, the top surface has a gate-overlaying zone, an orthographic projection of the gate-overlaying zone on the substrate overlaps the gate electrode, at least one of the first and second boundaries has an orthogonal projection on the substrate outside the gate electrode, the gate-overlaying zone and said at least one of the first and second boundaries define an offset region of the top surface therebetween, wherein the first boundary, the second boundary, the offset region and the gate-overlaying zone are coplanar, and wherein the insulating layer is in contact with the coplanar gate-overlaying zone and offset region and extends over tops of the source and drain electrodes.

2. The metal oxide thin film transistor of claim 1, wherein the orthographic projection of the source electrode on the substrate overlaps the gate electrode, and the orthographic projection of the drain electrode on the substrate does not overlap the gate electrode.

3. The metal oxide thin film transistor of claim 2, wherein an interval between the orthographic projection of the drain electrode on the substrate and the gate electrode is from 1 to 2.5 µm.

4. The metal oxide thin film transistor of claim 2, wherein an interval between the orthographic projection of the drain electrode on the substrate and the gate electrode is from 0.5 to 1 µm.

5. The metal oxide thin film transistor of claim 2, wherein an interval between the orthographic projection of the drain electrode on the substrate and the gate electrode is from 0 to 0.5 µm.

6. The metal oxide thin film transistor of claim 1, wherein the orthographic projection of the drain electrode on the substrate overlaps the gate electrode, and the orthographic projection of the source electrode on the substrate does not overlap the gate electrode.

7. The metal oxide thin film transistor of claim 6, wherein an interval between the orthographic projection of the source electrode on the substrate and the gate electrode is from 1 to 2.5 µm.

8. The metal oxide thin film transistor of claim 6, wherein an interval between the orthographic projection of the source electrode on the substrate and the gate electrode is from 0.5 to 1 µm.

9. The metal oxide thin film transistor of claim 6, wherein an interval between the orthographic projection of the source electrode on the substrate and the gate electrode is from 0 to 0.5 µm.

10. The metal oxide thin film transistor of claim 1, wherein neither the orthographic projection of the source electrode on the substrate nor the orthographic projection of the drain electrode on the substrate overlaps the gate electrode.

11. The metal oxide thin film transistor of claim 10, wherein an interval between the orthographic projection of the source electrode on the substrate and the gate electrode is from 1 to 2.5 µm.

12. The metal oxide thin film transistor of claim 10, wherein an interval between the orthographic projection of the source electrode on the substrate and the gate electrode is from 0.5 to 1 µm.

13. The metal oxide thin film transistor of claim 10, wherein an interval between the orthographic projection of the source electrode on the substrate and the gate electrode is from 0 to 0.5 µm.

14. The metal oxide thin film transistor of claim 10, wherein an interval between the orthographic projection of the drain electrode on the substrate and the gate electrode is from 1 to 2.5 µm.

15. The metal oxide thin film transistor of claim 10, wherein an interval between the orthographic projection of the drain electrode on the substrate and the gate electrode is from 0.5 to 1 µm.

16. The metal oxide thin film transistor of claim 10, wherein an interval between the orthographic projection of the drain electrode on the substrate and the gate electrode is from 0 to 0.5 µm.

17. The metal oxide thin film transistor of claim 1, wherein the insulating layer overlay the metal oxide active layer, the source electrode and the drain electrode.

* * * * *